United States Patent [19]

Takemae et al.

[11] Patent Number: 5,048,598
[45] Date of Patent: Sep. 17, 1991

[54] RESERVOIR TANK FOR A LIQUID COOLING SYSTEM

[75] Inventors: Motohiro Takemae, Fujisawa; Takaaki Kanki, Oyama; Hirofumi Takao, Kawasaki; Hisashi Kawashima, Yokohama; Hideo Katsumi, Kanagawa, all of Japan

[73] Assignee: Fujitsu Limited, Kawasaki, Japan

[21] Appl. No.: 469,114

[22] Filed: Jan. 24, 1990

[30] Foreign Application Priority Data

Feb. 6, 1989 [JP] Japan ................................. 1-26861

[51] Int. Cl.$^5$ .......................................... H01L 23/473
[52] U.S. Cl. ......................... 165/104.14; 165/104.31; 165/104.33; 165/119; 137/597; 366/165; 366/173
[58] Field of Search ...................... 165/104.33, 104.31, 165/104.32, 104.14; 55/191, 204; 366/165, 173; 137/597

[56] References Cited

U.S. PATENT DOCUMENTS

| | | | |
|---|---|---|---|
| 3,044,236 | 7/1962 | Bearden et al. | 55/204 |
| 3,127,255 | 3/1964 | Winslow | 55/204 |
| 3,774,667 | 11/1973 | Antonetti et al. | |
| 3,812,655 | 5/1974 | Bennett | 55/204 |
| 4,704,658 | 11/1987 | Yokouchi et al. | 165/104.33 |

FOREIGN PATENT DOCUMENTS 0075175 3/1983 European Pat. Off.
0313473 4/1986 European Pat. Off.

Primary Examiner—Albert W. Davis, Jr.
Attorney, Agent, or Firm—Armstrong, Nikaido, Marmelstein, Kubovcik & Murray

[57] ABSTRACT

A reservoir tank of the present invention employed in a liquid cooling system is provided with a plurality of outlets for feeding out the coolant and a plurality of inlets to which the coolant returns after cooling electronics devices. These outlets are provided at the center of bottom of the tank and these inlets are provided at the external circumference of the outlets. Incident angle of the inlets to the tank is inclined from the vertical line of tank so that the coolant generates a whirlpool around the vertical axis of tank. A cylindrical partition may be provided between the center of the bottom having the inlets and the circumferential part having the outlets, so as to prevent a short path of the coolant flowing from inlets to the outlets. In this case, holes may be provided at the partition so that the coolant stirred at the outside of partition flows to the outlets therethrough. In such a structure, the coolant is sufficiently stirred in the tank even if temperature of coolant returning to the tank is different on each inlet. Thereby, temperature of coolant fed out from the outlets is kept at a uniform temperature; therefore, uniform cooling of the electronic devices can be realized.

6 Claims, 6 Drawing Sheets

RESERVIOR TANK FOR A LIQUID COOLING SYSTEM

BACKGROUND OF THE INVENTION

1. Field of the Invention

This invention relates to a coolant reservoir tank for use in a liquid cooling system.

2. Description of the Related Art

Recently, a cooling system in which cooling is carried out by circulation of coolant, such as cooled water, has been used for absorbing the heat generated in an electronic apparatus formed with electronic components such as semiconductor devices. Such a cooling system has been structured, for example, as shown in FIG. 1. In order to cool a plurality of electronic devices 15-1~15-4, a cooling system 17 comprising a plurality of cooling units 16, each of which is composed of pumps 13 for feeding coolant 3 and heat exchangers 14 for cooling the coolant 3 to the predetermined temperature, is provided. The coolant 3 reserved in a reservoir tank 10 is fed to the respective cooling units 16 through a plurality of feed pipes 11A; the coolant 3 cooled to a predetermined temperature by the heat exchangers 14 is supplied to the electronic devices such as LSI (Large Scale Integrated Circuit) from the cooling unit 16; and the coolant 3 which has cooled the electronic devices 15-1~15-4 is returned to the reservoir tank 10 through a plurality of return pipes 11B. Such a cooling unit 16 can be expanded depending on the installed number of the electronic devices 15-1~15-4 on requirement. Therefore, the reservoir tank 10 is commonly provided with a plurality of feed pipes 11A and return pipes 11B for the coolant. In such a structure where the cooling is carried out by feeding the coolant 3 cooled down to the predetermined temperature to the electronic devices 15-1~15-4, it is essential to keep the temperature of the coolant 3 to be fed from each cooling unit 15 at a temperature lower than the specified temperature in order to always cool sufficiently the electronic devices 15-1~15-4. However, since heat exchanging capacity of such cooling unit 15 is limited, if temperatures of coolant 3 supplied from the reservoir tank 10 to the respective cooling units 16 are not equal, temperatures of coolant 3 fed from the respective cooling units 16 are inevitably not equal. Accordingly, the coolant 3 fed to each of the electronic devices 15-1~15-4 may no longer be cooled below the predetermined temperature, thus some electronic devices cannot be sufficiently cooled.

Therefore, it is necessary to provide a cooling unit in which the temperatures of the coolant 3 supplied via the plural feed pipes 11A from the reservoir tank 10 are equal so that the coolant 3 to be supplied from the cooling unit 16 is always kept at the predetermined temperature or lower. However, the conventional reservoir tank 10 has a following problem.

A typical example of the conventional reservoir tank is shown in the sectional view of side elevation of FIG. 2. A bottom 20A of a cylindrical vessel 20 is provided with a plurality of outlets 22 and inlets 23. The outlets 22 are connected with feed pipes 11A-1~11A-N, respectively, while the inlets 23 with return pipes 11B-1~11B-N. At the center of the vessel 20, a strainer 21 is provided for removing undesirable particles in the coolant. The coolant 3 returned as indicated by arrow marks C via the inlets 23 and the return pipes 11B-1~11B-N is reserved in the reservoir tank 20 and the coolant 3 filtered by the strainer 21 is output as indicated by arrow marks B via the outlets 22 and the feed pipes 11A-1~11A-N. Therefore, in such a structure, a distance between the inlet 23-1 and the outlet 22-1, both provided in the vicinity of the center of vessel 20 is extremely short and distance between the inlet 23-2 and the outlet 22-2, both provided in the vicinity of the wall of vessel 20 is very long. Meanwhile, since the heat loads of the electronic devices 15-1~15-4 are not always equal, temperature difference is generated in the coolant returned via each inlet 23. In this case, temperature of coolant output from the outlet 22-1 is influenced very much by the temperature of the coolant returned to the inlet 23-1. On the other hand, temperature of coolant output from the outlet 22-2 separated far from the inlet 23-2 is not influenced so much by the temperature of the coolant returned to inlet 23-2. Accordingly, non-equal temperatures of the coolant returned from the plural inlets cause a temperature difference in the coolant output from each of the plural outlets. Therefore, there lies a problem in that some coolant temperatures of the coolant output from the cooling units 16 do not become lower than the predetermined value. Consequently, uniform cooling cannot be achieved.

SUMMARY OF THE INVENTION

It is therefore an object of the present invention to provide a reservoir tank whose coolant is returned via a plurality of inlets and temperature of the coolant output from a plurality of outlets is kept uniform.

The reservoir tank of the present invention is so structure that the feed outlets are provided at the center of bottom of a vessel so that the coolant reserved in the reservoir tank generates a whirlpool in a predetermined direction of the flow of the coolant returned from the plural return inlets, the inlets are arranged at the outer side of the outlets and the inlets are directed to incline with respect to the vertical line of reservoir tank in order to generate the whirlpool of the coolant.

The above-mentioned features and advantages of the present invention, together with other objects and advantages, which will become apparent, will be more fully described hereinafter, with reference being made to the accompanying drawings which form a part thereof, wherein like numerals refer to like parts throughout.

DESCRIPTION OF THE PREFERRED EMBODIMENTS

Figure 1:
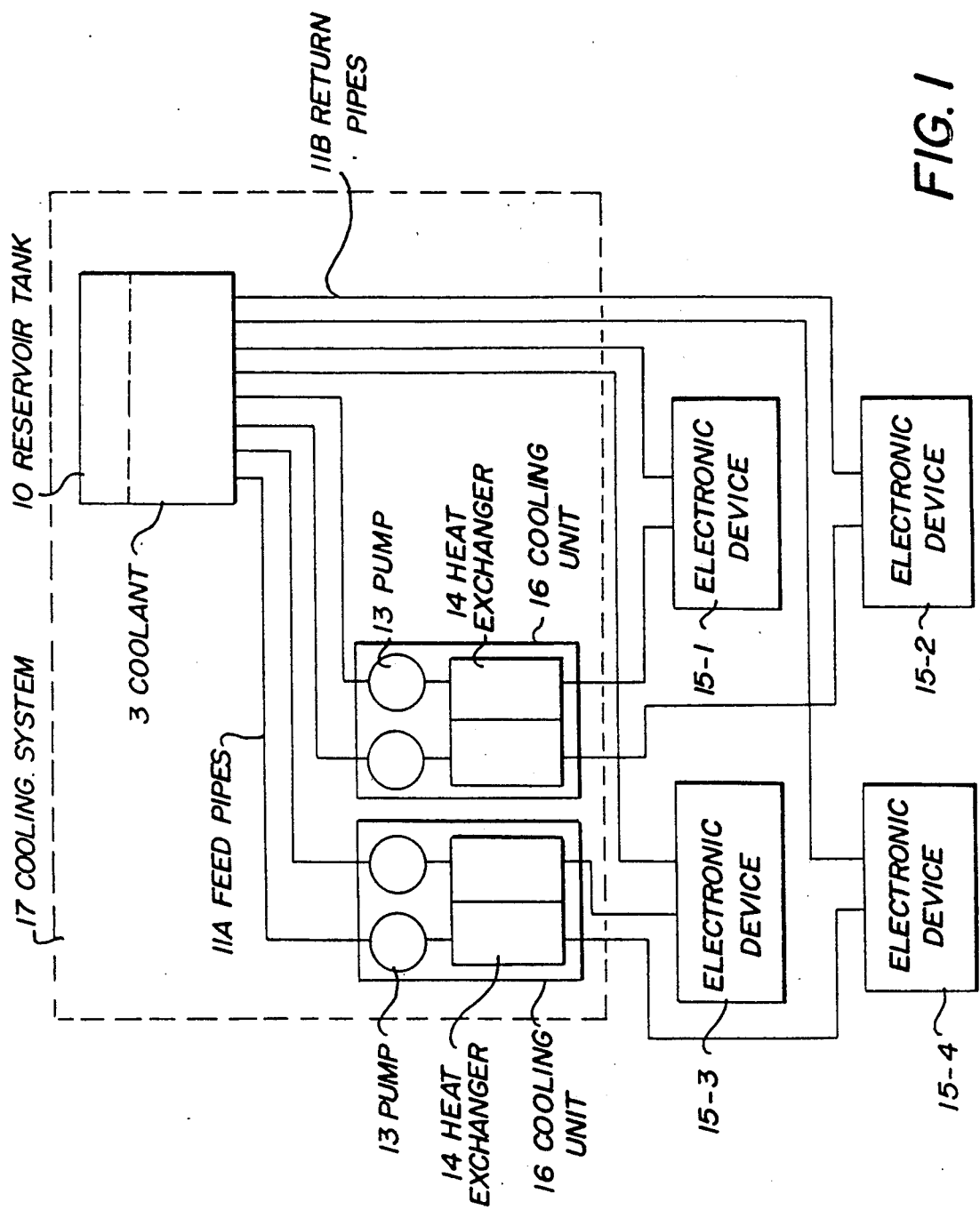
FIG. 1 shows a configuration of a liquid cooling system.
Figure 2:
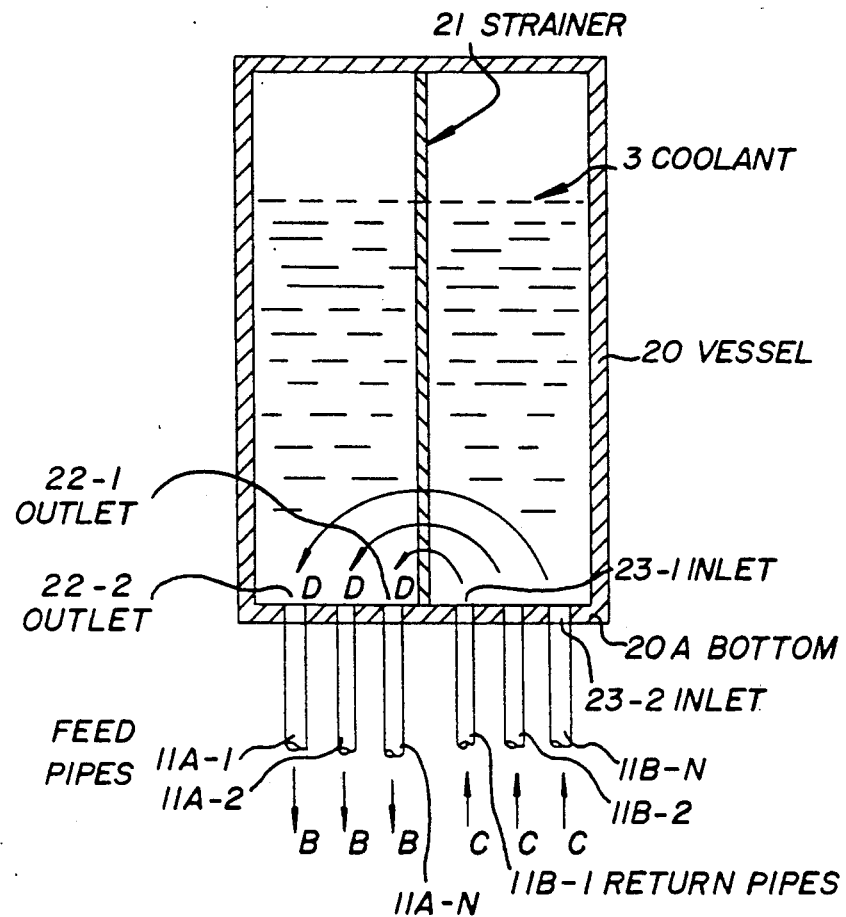
FIG. 2 is a sectional view of side elevation of a reservoir tank of prior art to be used in the cooling system of FIG. 1.

A reservoir tank 10 of the present invention will be explained in detail with reference to the principle diagram of FIG. 3 and the preferred embodiments of FIG. 4 to FIG. 6. The like elements are designated by the like numerals throughout the drawings.

The reservoir tank 10 is basically composed of a cylindrical vessel 1 and its bottom 2. Depression 2C formed at the center 2A of the bottom 2 of the cylindrical vessel 1, in which the coolant, for example, water is reserved, is provided with a strainer 6 and a plurality of outlets 5-1~5-N connected with a plurality of feed pipes 11A-1~11A-N. An outer ring 2B of the bottom 2 is provided with a plurality of inlets 4-1~4-N connected respectively to a plurality of return pipes 11B-1~11B-N. The coolant 3 returned as indicated by the arrow mark C from the return pipes 11B-1~11B-N is reserved in the vessel 1, the reserved coolant 3 is then filtered by the strainer 6 for elimination of undesirably contained particles and is then outputted as indicated by the arrow mark B from the feed pipes 11A-1~11A-N. A level meter 8 is provided at the side of the vessel 1 for monitoring the amount of the coolant 3 reserved within the vessel 1. On its top, a lid 1A mountable by a knob 1B is provided for additional supply of coolant 3. The lid 1A is provided with a stationary wire 6A and an end of the wire 6A is engaged with the strainer 6. When the strainer 6 is clogged, the strainer 6 can be cleaned after being removed by removing the lid 1A.

Figure 3:
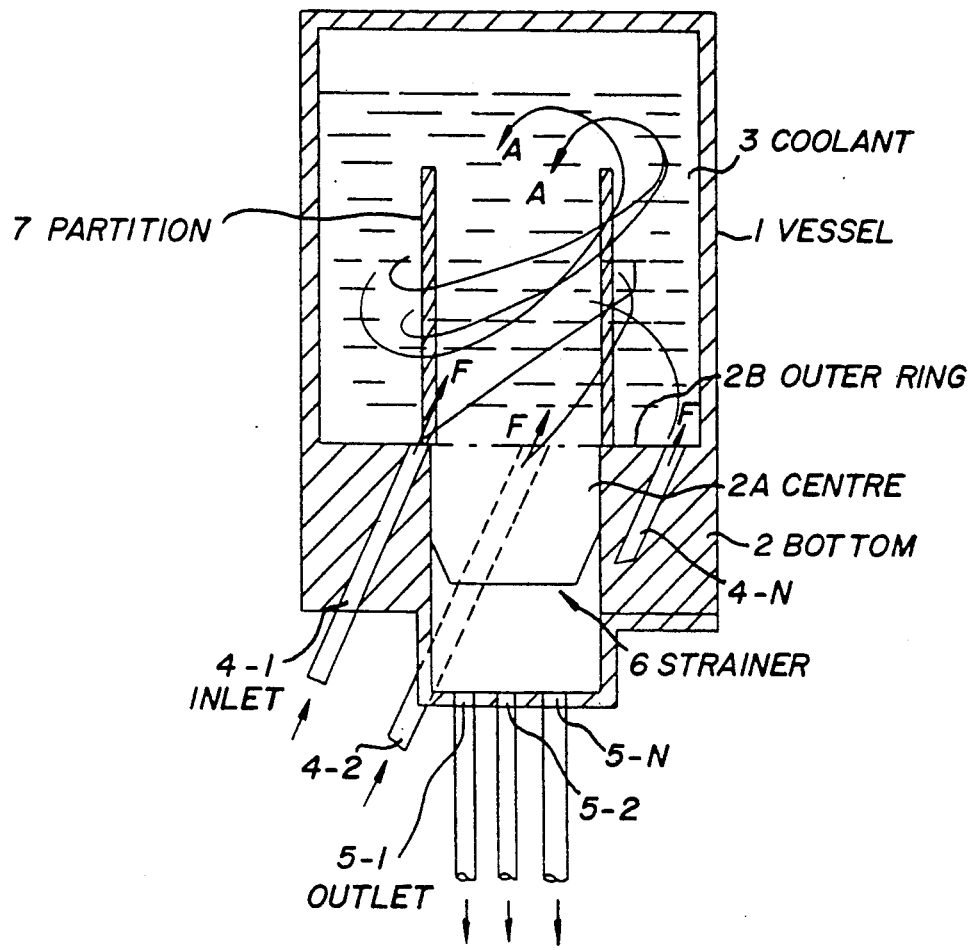
FIG. 3 is a sectional view of side elevation indicting the principle of the reservoir tank of the prevent invention.
Figure 4:
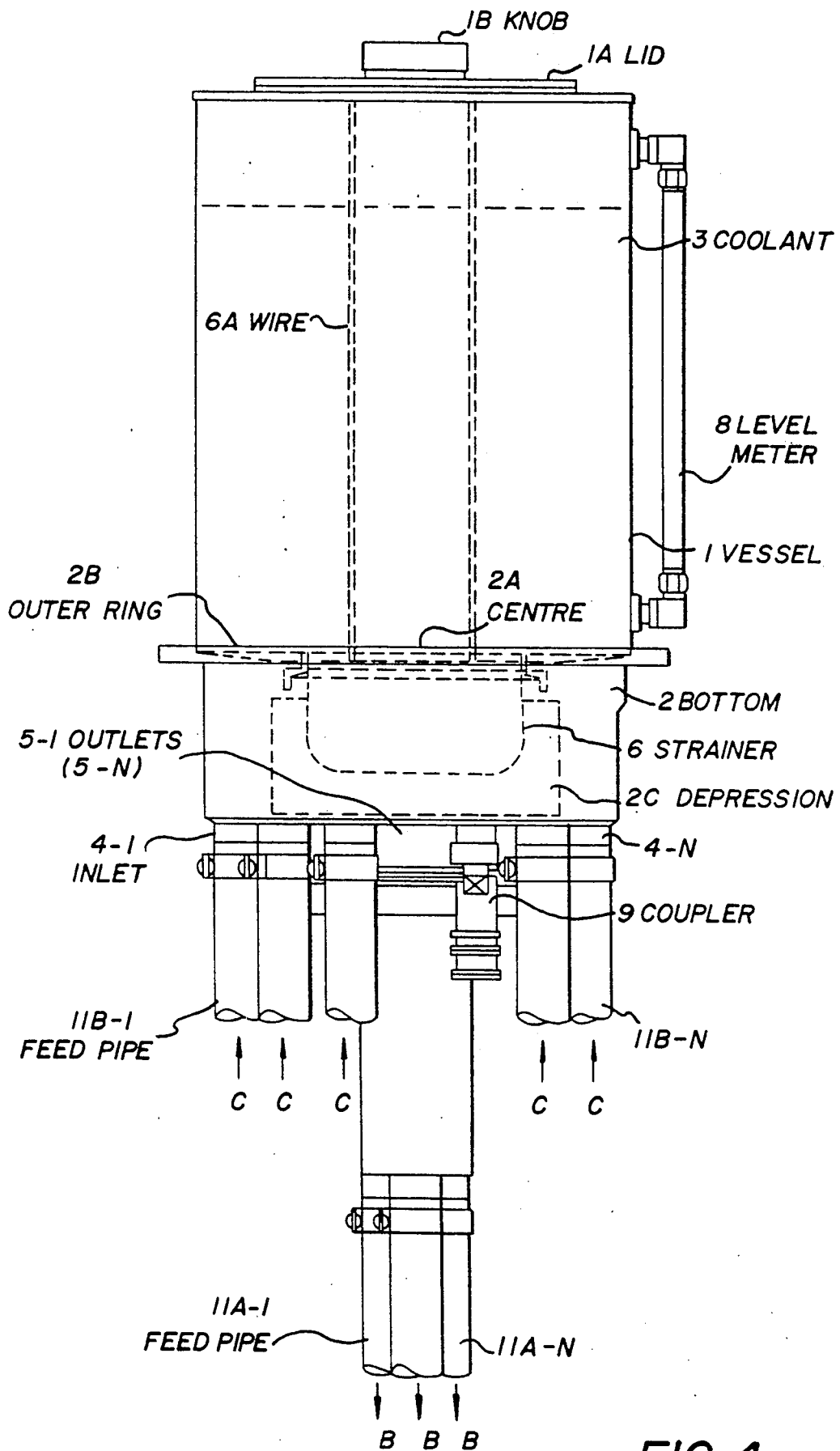
FIG. 4 is a side elevation of a preferred embodiment of the reservoir tank of the present invention.
Figure 5:
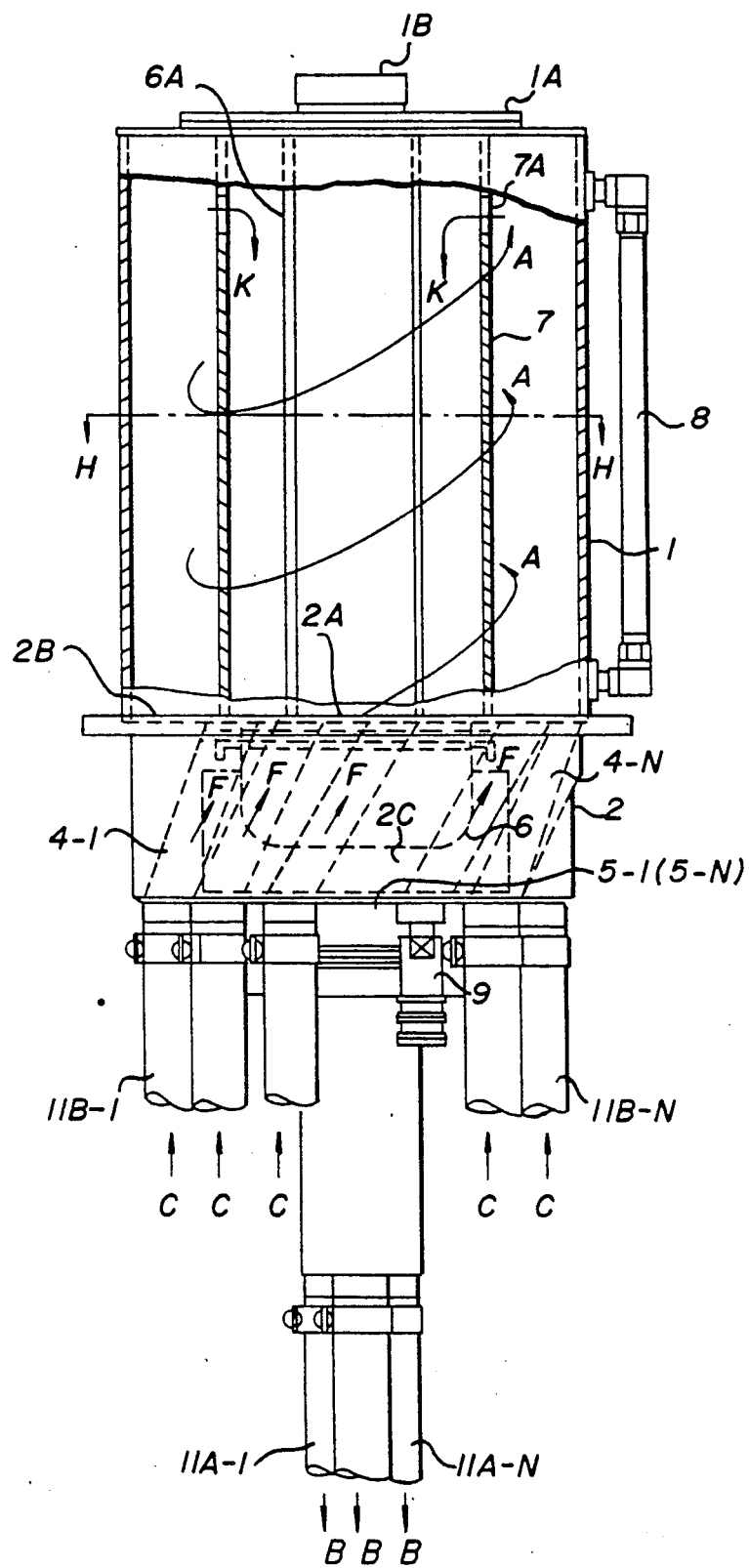
FIG. 5 is a sectional view of a side elevation of a preferred embodiment of the present invention shown in FIG. 4.
Figure 6:
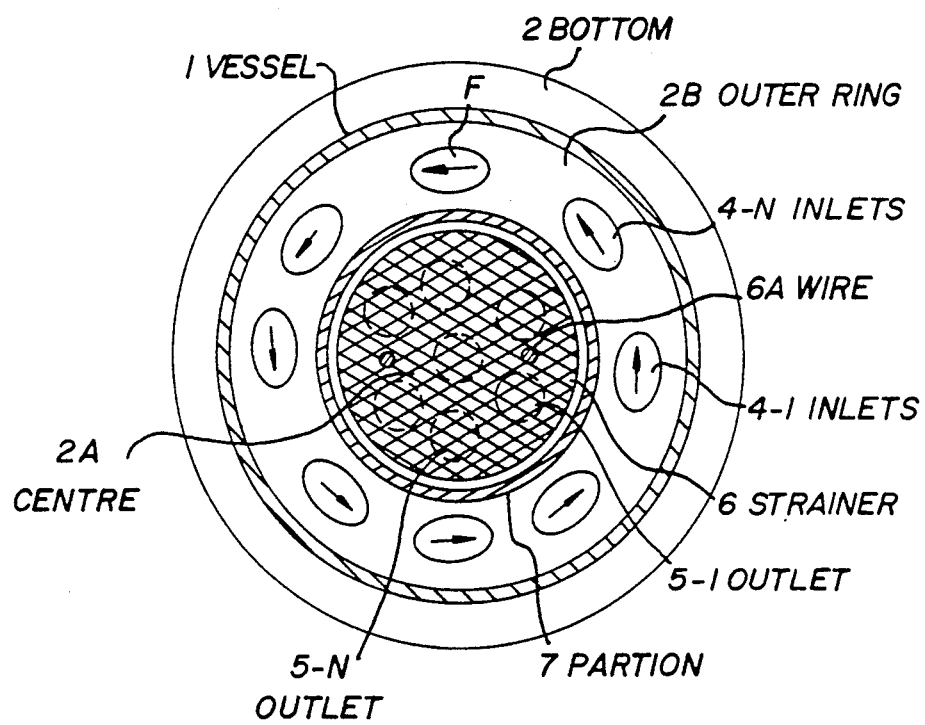
FIG. 6 is a sectional view along the line H—H in FIG. 5.

As shown in FIGS. 3 and 5, within the vessel 1, a cylindrical partition 7 for partitioning the center 2A of the bottom 2 having the outlets 5-1~5-N and the outer ring 2B of the bottom 2 having the inlets 4-1~4-N are provided. As shown in FIG. 6, the inlets 4-1~4-N provided at the outer ring 2B are arranged on a circle. The respective inlets 4-1~4-N are provided with inclination in the direction of arrow marks F shown in FIG. 5, from the vertical line of tank 10. Moreover in FIG. 6, the arrow marks F indicate the direction of the inclination of the respective inlets. The coolant 3 flowing into the tank 10 in the direction of arrow marks C from the inlets 4-1~4-N with a pressure of pumps 13 generates a whirlpool along the external circumference of the partition 7, as indicated by arrow marks A. The whirlpool stirs the coolant 3 reserved in the reservoir tank 10. As shown i FIG. 5, the stirred coolant 3 passes through the through holes 7A provided typically at the upper part of the partition 7 as indicated by arrow marks K and then flows into the center 2A. The coolant 3 passes through the strainer 6 and is output to the feed pipes 11A-1~11A-N as indicated by arrow marks B via the outlets 5-1~5-N.

With such structure, even if temperature of coolant 3 returned from one of the inlets is extremely high, temperature of the output coolant is uniformed since such high temperature coolant is sufficiently mixed with the coolant returned from the other inlets.

A coupler 9 provided in parallel to the outlets 5-1~5-N is connected with a pipe for checking the coolant 3 output from the outlets 5-1~5-N, upon requirement.

In above embodiment a cylindrical tank has been referred to, however, it is apparent that the concept of the present invention can also be applied to a square tank.

As explained previously, the present invention has achieved the uniformity of temperature of coolant output from a plurality of outlets by stirring and mixing the coolant reserved in the vessel with a flow of the coolant returned from a plurality of inlets. As a result, nonuniformity of cooling efficiency for electronic devices due to nonuniformity of temperature of coolant output from a plurality of outlets, which has been seen in the prior art, can be prevented; and thus, each of the electronic devices can be operated in a stable manner due to the predetermined cooling efficiency.

The many features and advantages of the present invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the present invention.

What I claim is:

1. A tank for containing a coolant, comprising:
   a plurality of outlets for feeding out said coolant, said outlets being located at a center portion of a bottom of said tank, and
   a plurality of inlets for returning said coolant into said tank, said inlets being located at an outer periphery of said center portion, each of said inlets being slanted from a vertical line of said tank so as to generate a whirlpool effect for said coolant coaxially around a vertical axis of said tank toward an upper portion of said tank.

2. A tank recited in claim 1, wherein said tank is of a vertical cylinder.

3. A tank recited in claim 1, further comprising a strainer for straining said coolant to be fed out.

4. A tank recited in claim 1, further comprising a partition installed on said bottom of said tank for partitioning said central portion and said outer peripheral portion, wherein a predetermined flow distance of said coolant from said inlets to said outlets is provided.

5. A tank recited in claim 4, wherein said partition is a vertical cylinder.

6. A tank recited in claim 4, wherein said partition comprises a hole for allowing said coolant in an outer peripheral space of said partition to flow therethrough into an inside space of said partition.

* * * * *